(12) United States Patent  
Yoo et al.

(10) Patent No.: US 12,513,990 B2  
(45) Date of Patent: Dec. 30, 2025

(54) LIGHT EMITTING DISPLAY APPARATUS (71) Applicant: LG Display Co., Ltd., Seoul (KR)

(72) Inventors: DongHee Yoo, Paju-si (KR); JongHyun Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 574 days.

(21) Appl. No.: 18/145,812

(22) Filed: Dec. 22, 2022

(65) Prior Publication Data  
US 2023/0207575 A1 Jun. 29, 2023

(30) Foreign Application Priority Data  
Dec. 23, 2021 (KR) .................. 10-2021-0186126

(51) Int. Cl.  
H10D 86/60 (2025.01)  
G01R 31/28 (2006.01)  
H10D 86/40 (2025.01)

(52) U.S. Cl.  
CPC ......... *H10D 86/60* (2025.01); *G01R 31/2844* (2013.01); *H10D 86/441* (2025.01)

(58) Field of Classification Search  
CPC ... H10D 86/60; H10D 86/441; G01R 31/2844  
See application file for complete search history.

(56) References Cited

U.S. PATENT DOCUMENTS

2011/0018571 A1* 1/2011 Kim ...................... G02F 1/1345  
324/760.02  
2019/0310509 A1* 10/2019 Shin ..................... H10D 86/481

* cited by examiner

Primary Examiner — Anne M Hines  
(74) Attorney, Agent, or Firm — Seed Intellectual Property Law Group LLP (57) ABSTRACT A light emitting display apparatus includes a first substrate including pixels and signal lines arranged in a first direction and a second substrate disposed on a rear surface of the first substrate, wherein a routing portion including routing lines is provided on a first lateral surface of the first substrate and a second lateral surface of the second substrate. In the first substrate, a first pad portion adjacent to the first lateral surface includes first pads connected to the signal lines and the routing lines and first test pads for determining the occurrence or not of defects of the routing lines. In the second substrate, a second pad portion adjacent to the second lateral surface includes second pads connected to the routing lines and second test pads connected to the first test pads.

14 Claims, 10 Drawing Sheets

LIGHT EMITTING DISPLAY APPARATUS

CROSS-REFERENCE TO RELATED APPLICATION

This application claims the benefit of the Korean Patent Application No. 10-2021-0186126 filed on Dec. 23, 2021, which is hereby incorporated by reference as if fully set forth herein.

BACKGROUND

Technical Field

The present disclosure relates to a light emitting display apparatus.

Description of the Related Art

A non-display area, which does not display an image, is provided at a border or an edge of a light emitting display panel.

In order to increase the immersion of a user, a width of the non-display area has been progressively reduced, and light emitting display panels including no non-display area have been proposed recently.

In order to manufacture light emitting display panels including no non-display area, routing lines for electrically connecting a first substrate, displaying an image, to a second substrate coupled to the first substrate and equipped with various drivers should be provided on lateral surfaces of the first substrate and the second substrate.

In this case, a structure for checking the quality of routing lines is needed.

BRIEF SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus in which test pads for measuring resistances of routing lines are provided between pads provided in a lateral surface of a light emitting display panel.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a first substrate including pixels and signal lines arranged in a first direction and a second substrate disposed on a rear surface of the first substrate, wherein a routing portion including routing lines is provided on a $1\text{-}1^{th}$, namely a first lateral surface of the first substrate and a $2\text{-}1^{th}$ lateral surface of the second substrate. In the first substrate, a first pad portion adjacent to the first lateral surface includes first pads connected to the signal lines and the routing lines and first test pads for determining the occurrence or not of defects of the routing lines. In the second substrate, a second pad portion adjacent to the $2\text{-}1^{th}$ lateral surface includes second pads connected to the routing lines and second test pads connected to the first test pads.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer may not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1:
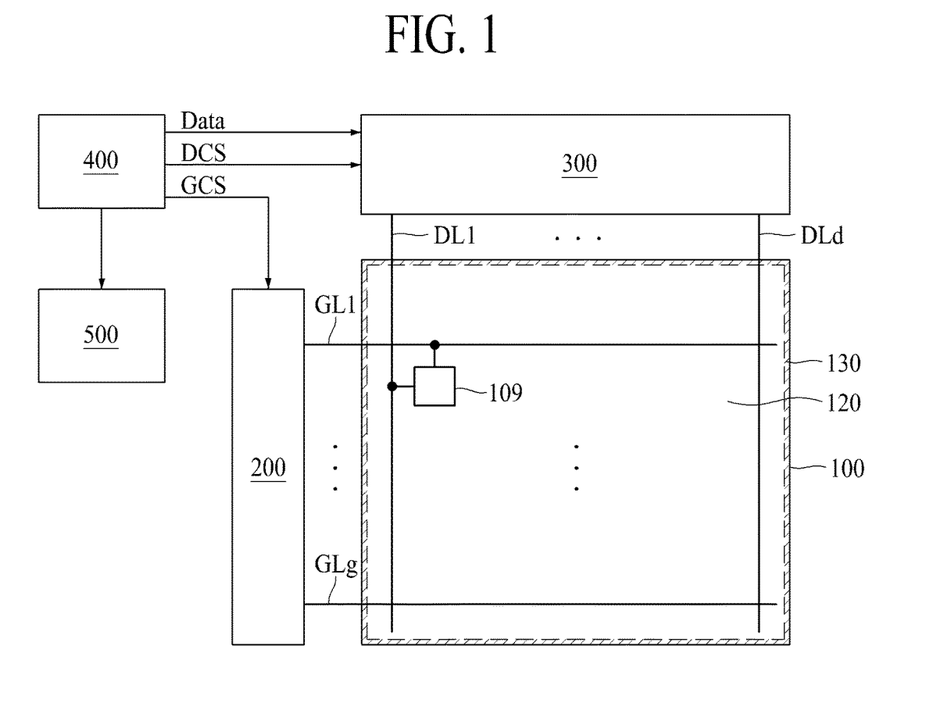
FIG. 1 is an example diagram illustrating a configuration of a light emitting display apparatus according to the present disclosure.
Figure 2:
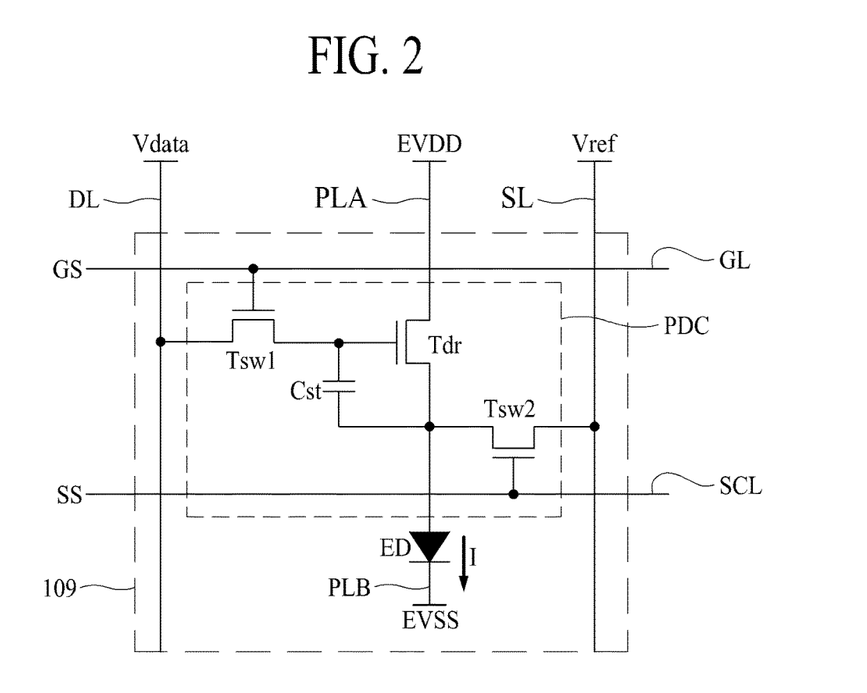
FIG. 2 is an example diagram illustrating a structure of a pixel applied to a light emitting display apparatus according to the present disclosure.

FIG. 1 is an example diagram illustrating a configuration of a light emitting display apparatus according to the present disclosure, and FIG. 2 is an example diagram illustrating a structure of a pixel applied to a light emitting display apparatus according to the present disclosure.

The light emitting display apparatus according to the present disclosure may configure various electronic devices.

The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 120 displaying an image and a non-display area 130 provided outside the display area 120, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller, the gate driver, the data driver, and the light emitting display panel. Particularly, in the light emitting display apparatus according to the present disclosure, stages included in the gate driver 200 may be provided in the display area 120, and the gate lines GL1 to GLg connected to the stages may be provided in the light emitting display panel 100.

First, the light emitting display panel 100 may include the display area 120 and the non-display area 130.

A plurality of pixels 109 displaying an image may be provided in the display area 120, and the non-display area 130 may surround the display area 120.

In the present disclosure, because the stages included in the gate driver 200 are provided in the display area 120, a width of the non-display area 130 may be minimized or reduced.

Particularly, in the present disclosure, the non-display area 130 may be omitted. That is, the display area 120 may be provided in a whole surface of a front surface of the light emitting display panel 100. In this case, as described above, because the gate driver 200 connected to the gate lines are provided in the display area, a non-display area for the gate driver 200 may be omitted. Also, for example, ends of the data lines connected to the data driver 300 may extend to an upper end of the light emitting display panel 100 illustrated in FIG. 1 and a rear surface of the light emitting display panel through a lateral surface connected to the upper end and may be connected to the data driver 300 at the rear surface of the light emitting display panel. Therefore, a non-display area for the gate driver 200 and the data driver 300 and pads for connecting the gate lines and the data lines to the gate driver 200 and the data driver 300 may not be provided in the front surface of the light emitting display panel 100. Accordingly, in the present disclosure, the non-display area 130 may be omitted.

However, the present disclosure is not limited thereto. Accordingly, the non-display area 130 for arranging various lines and pads may be provided outside the display area 120.

The gate lines GL1 to GLg, the data lines DL1 to DLd, and the pixels 109 may be provided in the display area 120. Also, the stages configuring the gate driver 200 may be provided in the display area 120. Accordingly, the display area 120 may display an image. Here, g and d may each be a natural number.

The pixel 109 included in the light emitting display panel 100, as illustrated in FIG. 2, may include an emission area which includes a pixel driving circuit PDC, including a switching transistor Tsw1, a storage capacitor Cst, a driving transistor Tdr, and a sensing transistor Tsw2, and a light emitting device ED.

A first terminal of the driving transistor Tdr may be connected to a high voltage supply line PLA through which a high voltage EVDD is supplied, and a second terminal of the driving transistor Tdr may be connected to the light emitting device ED. An anode of the light emitting device ED may be connected to the second terminal of the driving transistor Tdr, and a cathode of the light emitting device ED may be connected to a low voltage supply line PLB through which a low voltage EVSS is supplied.

A first terminal of the switching transistor Tsw1 may be connected to the data line DL, a second terminal of the switching transistor Tsw1 may be connected to a gate of the driving transistor Tdr, and a gate of the switching transistor Tsw1 may be connected to a gate line GL.

A data voltage Vdata may be supplied to a data line DL, and a gate signal GS may be supplied to the gate line GL.

The sensing transistor Tsw2 may be provided for measuring a threshold voltage or mobility of the driving transistor. A first terminal of the sensing transistor Tsw2 may be connected to a second terminal of the driving transistor Tdr and the light emitting device ED, a second terminal of the sensing transistor Tsw2 may be connected to a reference voltage line SL through which a reference voltage Vref is supplied, and a gate of the sensing transistor Tsw2 may be connected to a sensing control line SCL through which a sensing control signal SS is supplied.

A structure of the pixel 109 included in the light emitting display panel 100 is not limited to a structure illustrated in FIG. 2. Accordingly, a structure of the pixel 109 may be changed to various shapes.

An insulation layer and various electrodes configuring the pixels 109 may be provided on a base substrate (hereinafter simply referred to as a substrate) such as a glass substrate or a film. That is, the light emitting display panel 100 may include a substrate, a plurality of insulation layers provided on the substrate, and a plurality of electrodes provided on the substrate.

The data driver 300 may supply data voltages to the data lines.

The controller 400 may realign input video data transferred from an external system by using a timing synchronization signal transferred from the external system and may generate a data control signal DCS which is to be supplied to the data driver 300 and a gate control signal GCS which is to be supplied to the gate driver 200.

To this end, the controller 400 may include a data aligner which realigns input video data to generate image data Data and supplies the image data Data to the data driver 300, a control signal generator which generates the gate control signal GCS and the data control signal DCS by using the timing synchronization signal, an input unit or circuit which receives the timing synchronization signal and the input video data transferred from the external system and respectively transfers the timing synchronization signal and the input video data to the control signal generator and the data aligner, and an output unit or circuit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video information.

The power supply 500 may generate various powers and may supply the generated powers to the controller 400, the gate driver 200, the data driver 300, and the light emitting display panel 100.

The gate driver 200 may supply gate pulses to the gate lines GL1 to GLg. When the gate pulse generated by the gate driver 200 is supplied to the gate of the switching transistor Tsw1 included in the pixel 109, the switching transistor Tsw1 may be turned on. When the switching transistor Tsw1 is turned on, a data voltage supplied through a data line may be supplied to the pixel 109. When a gate-off signal generated by the gate driver 200 is supplied to the gate of the switching transistor Tsw1, the switching transistor Tsw1 may be turned off. When the switching transistor Tsw1 is turned off, a data voltage may not be supplied to the pixel 109 any longer. The gate signal GS supplied to the gate line GL may include the gate pulse and the gate-off signal.

The gate driver 200 may include a plurality of stages, and the stages may be connected to the gate lines GL1 to GLg.

The stages may be included in the light emitting display panel 100, and particularly, may be provided in the display area 120.

Figure 3:
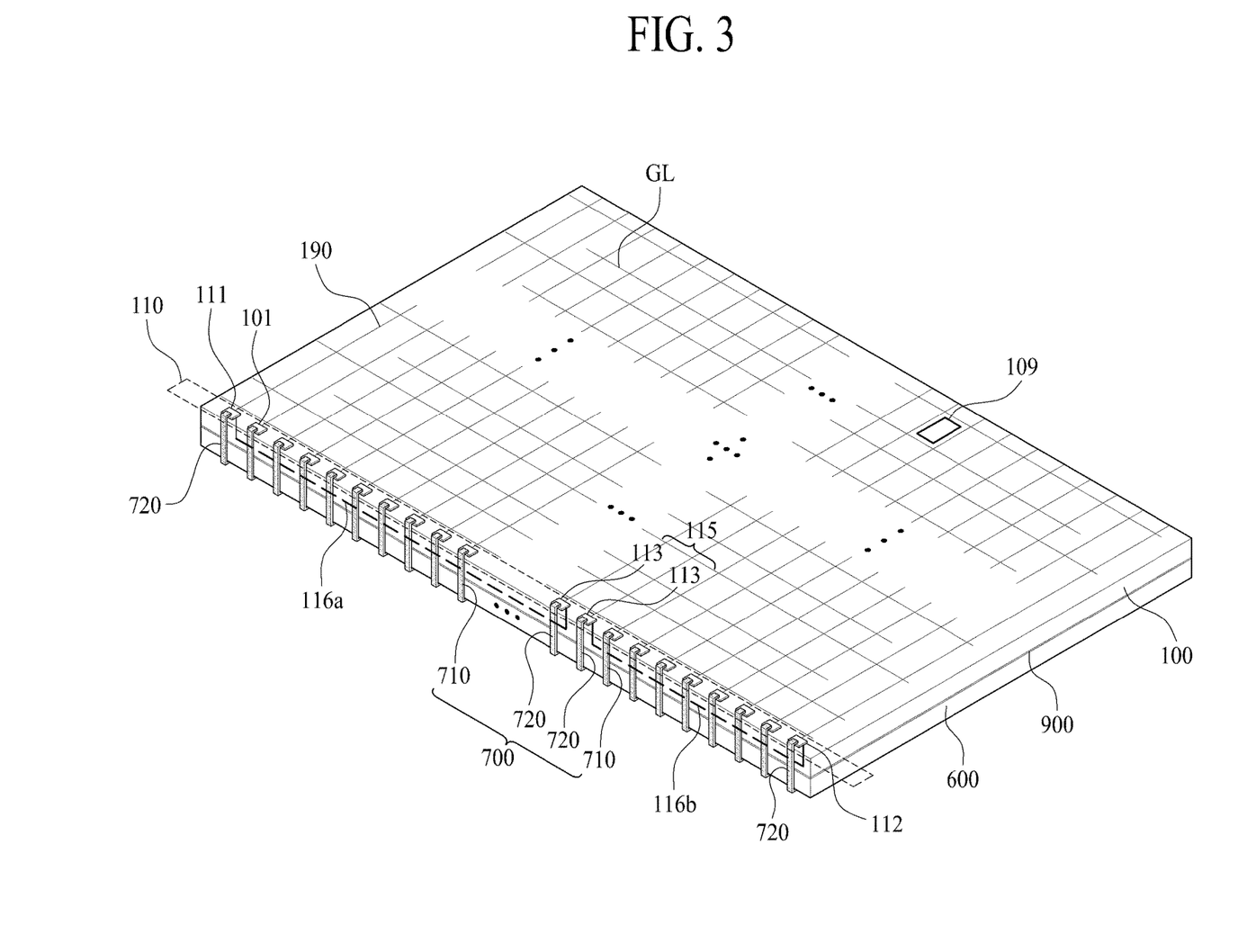
FIG. 3 is a perspective view illustrating a front surface of a light emitting display apparatus according to the present disclosure.
Figure 4:
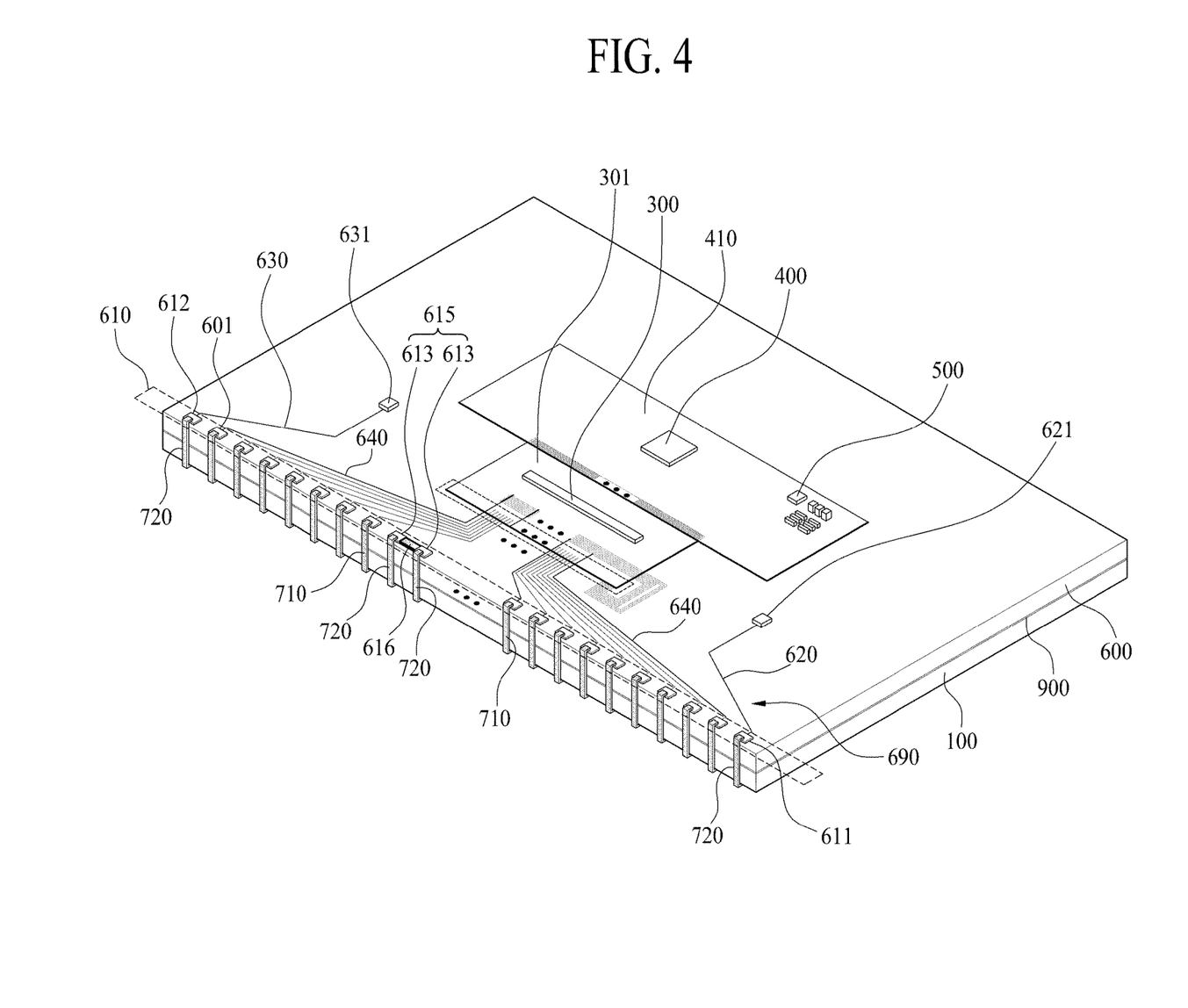
FIG. 4 is a perspective view illustrating a rear surface of a light emitting display apparatus according to the present disclosure.
Figure 5:
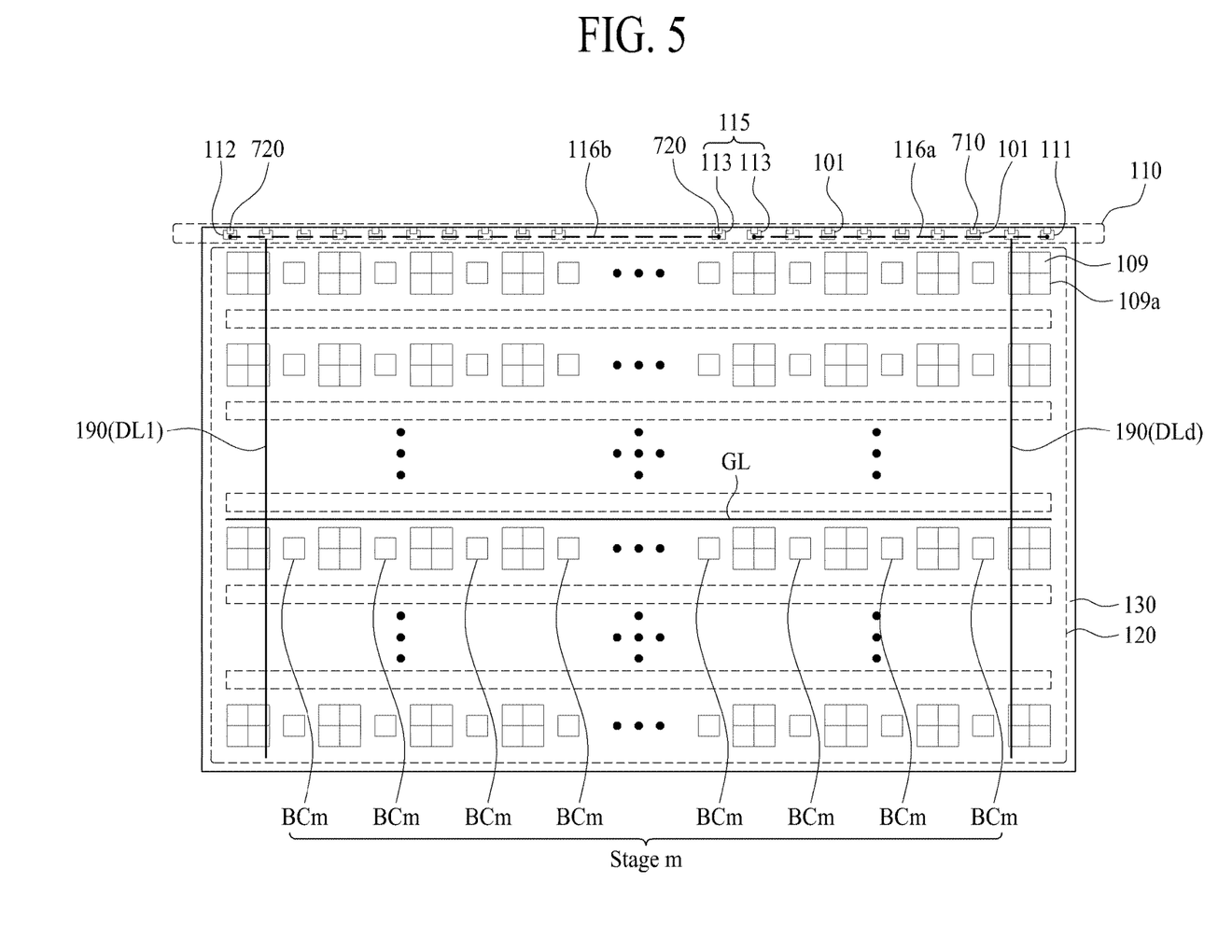
FIG. 5 is a plan view illustrating a front surface of a light emitting display apparatus according to the present disclosure.

FIG. 3 is a perspective view illustrating a front surface of a light emitting display apparatus according to the present disclosure, FIG. 4 is a perspective view illustrating a rear surface of a light emitting display apparatus according to the present disclosure, and FIG. 5 is an example diagram illustrating a front surface of a light emitting display apparatus according to the present disclosure.

The light emitting display apparatus according to the present disclosure may include a first substrate 100, including signal lines 190 arranged in a first direction, and a second substrate 600 which is disposed on a rear surface of the first substrate 100. The first substrate 100 may be bonded to the second substrate 600 by a coupling member 900.

The first substrate 100 may be the light emitting display panel 100 described above with reference to FIGS. 1 and 2. In the following description, therefore, reference numeral "100" assigned to the light emitting display panel may be used as a reference numeral of the first substrate.

The signal lines 190 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200.

The power lines may include a high voltage supply line PLA and a low voltage supply line PLB illustrated in FIGS. 1 and 2.

First, a routing portion 700 including a plurality of routing lines 710 may be provided on a 1-1$^{th}$, namely a first, lateral surface of the first substrate 100 and a 2-1$^{th}$ lateral surface of the second substrate 600.

Therefore, in FIGS. 3 and 4, the 1-1$^{th}$ lateral surface and the 2-1$^{th}$ lateral surface may denote lateral surfaces where the routing portion 700 is provided.

In the first substrate 100, a first pad portion 110 adjacent to the 1-1$^{th}$ lateral surface may include a plurality of first pads 101 which are connected to the signal lines 190 and the routing lines 710.

Moreover, the first pad portion 110 may include a 1-1$^{th}$ main test pad 111, a 1-2$^{th}$ main test pad 112, and a 1-1$^{th}$ test pad portion 115 provided between the 1-1$^{th}$ main test pad 111 and the 1-2$^{th}$ main test pad 112.

That is, the first pad portion 110 may include the first pad 101, the 1-1$^{th}$ main test pad 111, the 1-2$^{th}$ main test pad 112, and the 1-1$^{th}$ test pad portion 115.

For example, as illustrated in FIG. 3, the 1-1$^{th}$ main test pad 111 may be provided at one end of the first pad portion 110, and the 1-2$^{th}$ main test pad 112 may be provided at the other end of the first pad portion 110.

The 1-1$^{th}$ test pad portion 115 may be provided at various positions of the first pad portion 110, and for example, may be disposed at a center portion of the first pad portion 110.

In the second substrate 600, a second pad portion 610 adjacent to the 2-1$^{th}$ lateral surface may include a plurality of second pads 601 which are connected to the routing lines 710.

Moreover, the second pad portion 610 may include a 2-1$^{th}$ main test pad 611, a 2-2$^{th}$ main test pad 612, and a 2-1$^{th}$ test pad portion 615.

That is, the second pad portion 610 may include the second pad 601, the 2-1$^{th}$ main test pad 611, the 2-2$^{th}$ main test pad 612, and the 2-1$^{th}$ test pad portion 615.

Here, the 1-1$^{th}$ main test pad 111, the 1-2$^{th}$ main test pad 112, and the 1-1$^{th}$ test pad portion 115 may be first test pads for determining the occurrence or not of an error of the routing lines 710. That is, the first pad portion 110 may include first test pads for determining the occurrence or not of an error of the routing lines 710, and the first test pads may include the 1-1$^{th}$ main test pad 111, the 1-2$^{th}$ main test pad 112, and the 1-1$^{th}$ test pad portion 115.

In this case, the second pad portion 610 may include second test pads which are connected to the first test pads and are used to determine the occurrence or not of an error of the routing lines 710. That is the second pad portion 610 may include second test pads for determining the occurrence or not of an error of the routing lines 710, and the second test pads may include the 2-1$^{th}$ main test pad 611, the 2-2$^{th}$ main test pad 612, and the 2-1$^{th}$ test pad portion 615.

For example, as illustrated in FIG. 4, the 2-1$^{th}$ main test pad 611 may be provided at one end of the second pad portion 610, and the 2-2$^{th}$ main test pad 612 may be provided at the other end of the second pad portion 610.

The 2-1$^{th}$ test pad portion 615 may be provided at various positions of the second pad portion 610, and for example, may be disposed at a center portion of the second pad portion 610.

Particularly, the 2-1$^{th}$ main test pad 611, the 2-2$^{th}$ main test pad 612, and the 2-1$^{th}$ test pad portion 615 may be disposed to face the 1-1$^{th}$ main test pad 111, the 1-2$^{th}$ main test pad 112, and the 1-1$^{th}$ test pad portion 115.

Therefore, the 2-1$^{th}$ main test pad 611, the 2-2$^{th}$ main test pad 612, and the 2-1$^{th}$ test pad portion 615 may be connected to the 1-1$^{th}$ main test pad 111, the 1-2$^{th}$ main test pad 112, and the 1-1$^{th}$ test pad portion 115 through test routing lines 720 included in the routing portion 700.

That is, the 2-1th main test pad 611 may be connected to the 1-1$^{th}$ main test pad 111 through a corresponding test routing line 720, and the 2-2$^{th}$ main test pad 612 may be connected to the 1-2$^{th}$ main test pad 112 through a corresponding test routing line 720.

To provide an additional description, the 1-1$^{th}$ main test pad 111 and the 2-1$^{th}$ main test pad 611 may be provided to be paired and may be connected to each other through a corresponding test routing line 720.

The 1-2$^{th}$ main test pad 112 and the 2-2$^{th}$ main test pad 612 may be provided to be paired and may be connected to each other through a corresponding test routing line 720.

Moreover, the 1-1$^{th}$ test pad portion 115 and the 2-1$^{th}$ test pad portion 615 may be provided to be paired and may be electrically connected to each other.

Moreover, the first pads 101 and the second pads 601 may be provided to be paired and may be connected to each other through a corresponding test routing line 710.

The 1-1$^{th}$ test pad portion 115 may include two 1-1$^{th}$ test pads 113 adjacent to each other.

The 2-1$^{th}$ test pad portion 615 may include two 2-1$^{th}$ test pads 613 which are adjacent to each other and are connected to each other. That is, the two 2-1$^{th}$ test pads 613 may be connected to each other through a test pad connection line 616 included in the 2-1$^{th}$ test pad portion 615.

Each of the two 1-1$^{th}$ test pads 113 may be connected to the 2-1th test pad 613, facing each other among the two 2-1$^{th}$ test pads 613, through the test routing line 720 included in the routing portion.

That is, the 2-1$^{th}$ main test pad 611 may be connected to the 1-1$^{th}$ main test pad 111 through a corresponding test routing line 720, the 2-2$^{th}$ main test pad 612 may be connected to the 1-2$^{th}$ main test pad 112 through a corresponding test routing line 720, and the two 1-1$^{th}$ test pads 113 may be connected to the two 2-1$^{th}$ test pads 613 facing each other through a corresponding test routing line 720.

Finally, as illustrated in FIG. 4, a link line portion 690 including link lines 640 connected to the second pads 601 may be provided in the second substrate 600.

The link line portion 690 may include a 2-1$^{th}$ test link line 620 and a 2-2$^{th}$ test link line 630 as well as the link line 640.

That is, as illustrated in FIG. 4, the link lines 640 connected to the second pads 601, the 2-1$^{th}$ test link line 620 connected to the 2-1$^{th}$ main test pad 611, and the 2-2$^{th}$ test link line 630 connected to the 2-2$^{th}$ main test pad 612 may be provided in a rear surface of the second substrate 600.

A 2-1$^{th}$ measurement pad 621 connected to a resistance measurement device may be provided at an end of the 2-1$^{th}$ test link line 620, and a 2-2$^{th}$ measurement pad 631 connected to the resistance measurement device may be provided at an end of the 2-2$^{th}$ test link line 630.

In this case, the link lines 640 may be provided between the 2-1$^{th}$ test link line 620 and the 2-2$^{th}$ test link line 630.

The link lines 640 may be connected to at least one driver.

Some of the link lines 640 may be connected to a data driver 300, some of the link lines 640 may be connected to a controller 400, and some of the link lines 640 may be connected to a power supply 500.

For example, in FIG. 4, as an example of the present disclosure, a light emitting display apparatus is illustrated where the link lines 640 are connected to the data driver 300 through a first printed circuit board (PCB) 301 equipped with the data driver 300 and the first PCB 301 is connected to a second PCB 410 equipped with the controller 400.

In this case, the power supply 500 may be mounted on the second PCB 410.

Moreover, link lines 640 connected to the controller 400 and the power supply 500 among the link lines 640 may be connected to the controller 400 and the power supply 500 through the first PCB 301 and the second PCB 410.

To this end, lines connected to the link lines 640 may be provided in the first PCB 301 and the second PCB 410.

The 2-1$^{th}$ measurement pad 621 and the 2-2$^{th}$ measurement pad 631, as illustrated in FIG. 4, may be directly provided on the rear surface of the second substrate 600, but may be mounted on the first PCB 301 or the second PCB 410. When the 2-1$^{th}$ measurement pad 621 and the 2-2$^{th}$ measurement pad 631 are included in the first PCB 301 or the second PCB 410, lines connected to the 2-1$^{th}$ test link line 620 and the 2-2$^{th}$ test link line 630 may be mounted on the first PCB 301 or the second PCB 410.

Hereinafter, a structure (particularly, a structure of a first substrate 100) of a light emitting display apparatus according to the present disclosure including elements described above will be described with reference to FIGS. 1 to 5.

As described above, the light emitting display apparatus according to the present disclosure may include a first substrate 100, including pixels 109 and signal lines 190 arranged in a first direction, and a second substrate 600 which is disposed on a rear surface of the first substrate 100.

The signal lines 190 and the pixels 109 may be included in the first substrate 100. The signal lines 190 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200. Hereinafter, for convenience of description, as an example of the present disclosure, a light emitting display apparatus where the signal lines 190 are data lines will be described.

That is, as illustrated in FIGS. 3 and 5, the pixels 109 may be provided in the first substrate 100, and the data lines DL connected to first pads 101 may be provided in the first substrate 100.

The first pads 101 may be included in a first pad portion 110, and in addition to the first pads 101, a 1-1$^{th}$ main test pad 111, a 1-2$^{th}$ main test pad 112, and a 1-1$^{th}$ test pad portion 115 may be provided in the first pad portion 110.

The gate driver 200 may include stages, for sequentially outputting gate pulses.

Each of the stages may include a plurality of stage transistors.

In this case, the stage transistors may be provided in a display area 120 of the first substrate.

For example, as illustrated in FIG. 5, an m$^{th}$ stage Stage m may include a plurality of m$^{th}$ branch circuit units BCm, and each of the m$^{th}$ branch circuit units BCm may include at least one stage transistor included in the m$^{th}$ stage Stage m. However, when the number of stage transistors included in the m$^{th}$ stage Stage m is less than the number of m$^{th}$ branch circuit units BCm, a stage transistor may not be included in at least one m$^{th}$ branch circuit unit BCm.

The m$^{th}$ branch circuit units BCm, as illustrated in FIG. 5, may be provided between unit pixels 109a configured with four pixels 109. For example, the unit pixel 109a may include a white pixel, a red pixel, a green pixel, and a blue pixel.

That is, the unit pixels 109a may be provided along a gate line GL arranged in a direction which differs from the data lines DL1 to DLd, and thus, the m$^{th}$ branch circuit units BCm may also be provided along the gate line GL.

In this case, a stage line portion including stage lines connected to the m$^{th}$ branch circuit units BCm may be provided along the gate line GL.

Moreover, gate clock lines which are connected to all stages and transfer gate clocks to all stages and gate power lines which transfer gate driving voltages to the gate driver 200 may be arranged in parallel with the data lines DL1 to DLd. The gate clock lines and the gate power lines may be connected to the first pads 101. In this case, the gate clock lines and the gate power lines may be included in the signal lines 190.

That is, in the light emitting display apparatus according to the present disclosure, the gate driver 200 may be provided in the display area 120 of the first substrate 100, and various lines described above may be the signal lines 190.

In this case, the signal lines 190 may be connected to the first pads 101 included in the first pad portion 110 of the first substrate 100.

The first pads 101 may be connected to second pads 601 included in a second pad portion 610 of the second substrate 600 through the routing lines 710 provided on a 1-1$^{th}$ lateral surface of the first substrate 100 and a 2-1$^{th}$ lateral surface of the second substrate 600.

The link lines 640 connected to the second pads 601 may be connected to the data driver 300, the controller 400, and the power supply 500, which are provided on the rear surface of the second substrate 600.

In this case, the 1-1$^{th}$ main test pad 111, the 1-2$^{th}$ main test pad 112, and the 1-1$^{th}$ test pads 113 included in the first pad portion 110 may be connected to the 2-1$^{th}$ main test pad 611, the 2-2$^{th}$ main test pad 612, and the 2-1$^{th}$ test pads 613, included in the second pad portion 610, through the test routing lines 720 provided on the 1-1$^{th}$ lateral surface of the first substrate 100 and the 2-1$^{th}$ lateral surface of the second substrate 600.

In the rear surface of the second substrate 600, a 2-1$^{th}$ measurement pad 621 connected to a resistance measurement device may be provided at an end of the 2-1$^{th}$ test link line 620, and a 2-2$^{th}$ measurement pad 631 connected to the resistance measurement device may be provided at an end of the 2-2$^{th}$ test link line 630 connected to the 2-2$^{th}$ main test pad 612.

The 2-1$^{th}$ measurement pad 621 and the 2-2$^{th}$ measurement pad 631, as illustrated in FIG. 4, may be directly provided on the rear surface of the second substrate 600, or may be mounted on the first PCB 301 or the second PCB 410.

Hereinafter, various examples of a light emitting display apparatus according to the present disclosure will be described with reference to FIGS. 6 to 11. In the following description, details which are the same or similar to details described above with reference to FIGS. 1 to 5 are omitted or will be briefly described.

Figure 6:
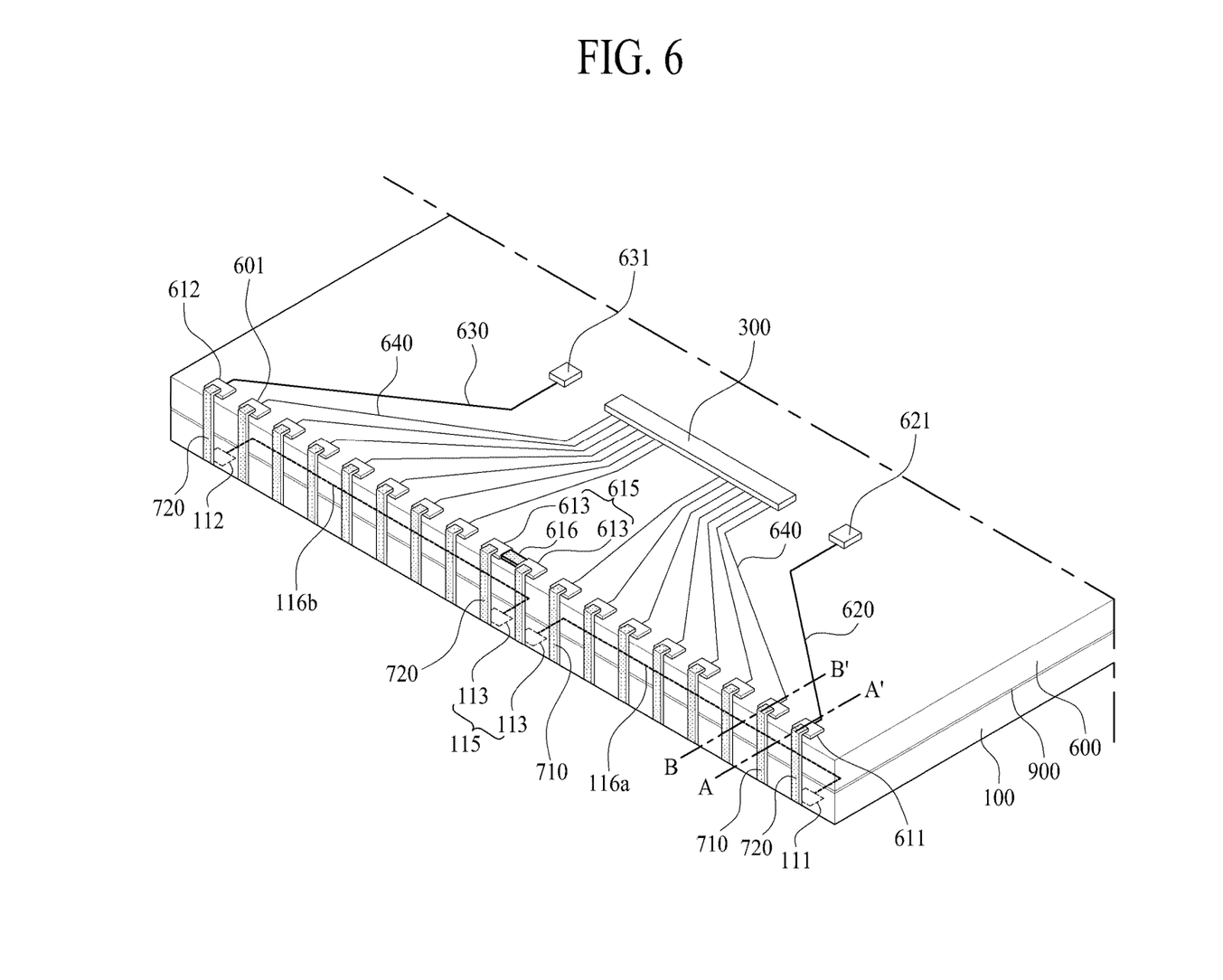
FIG. 6 is an example diagram schematically illustrating a rear surface of a light emitting display apparatus according to the present disclosure.
Figure 7:
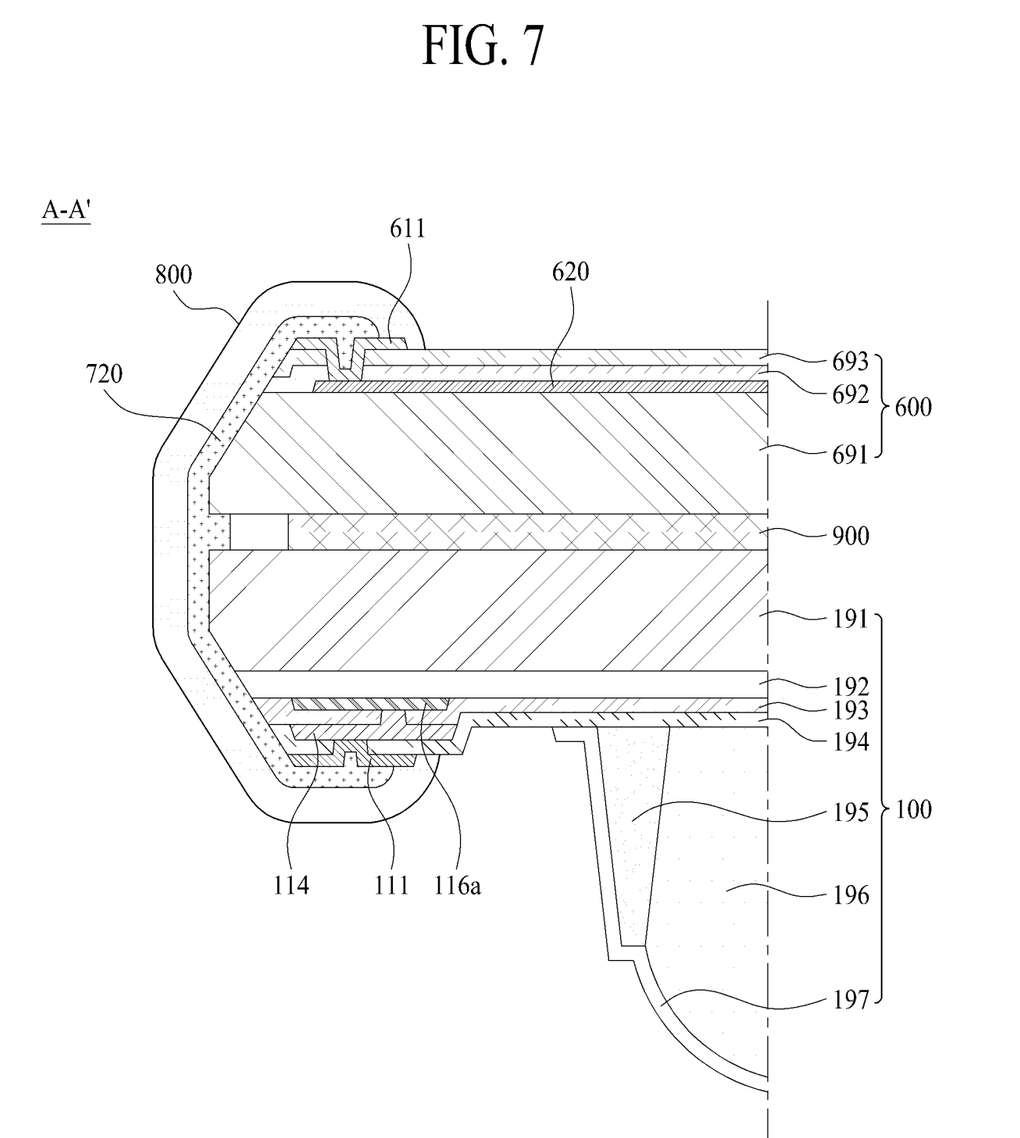
FIG. 7 is an example diagram illustrating a cross-sectional surface taken along line A-A' illustrated in FIG. 6.
Figure 8:
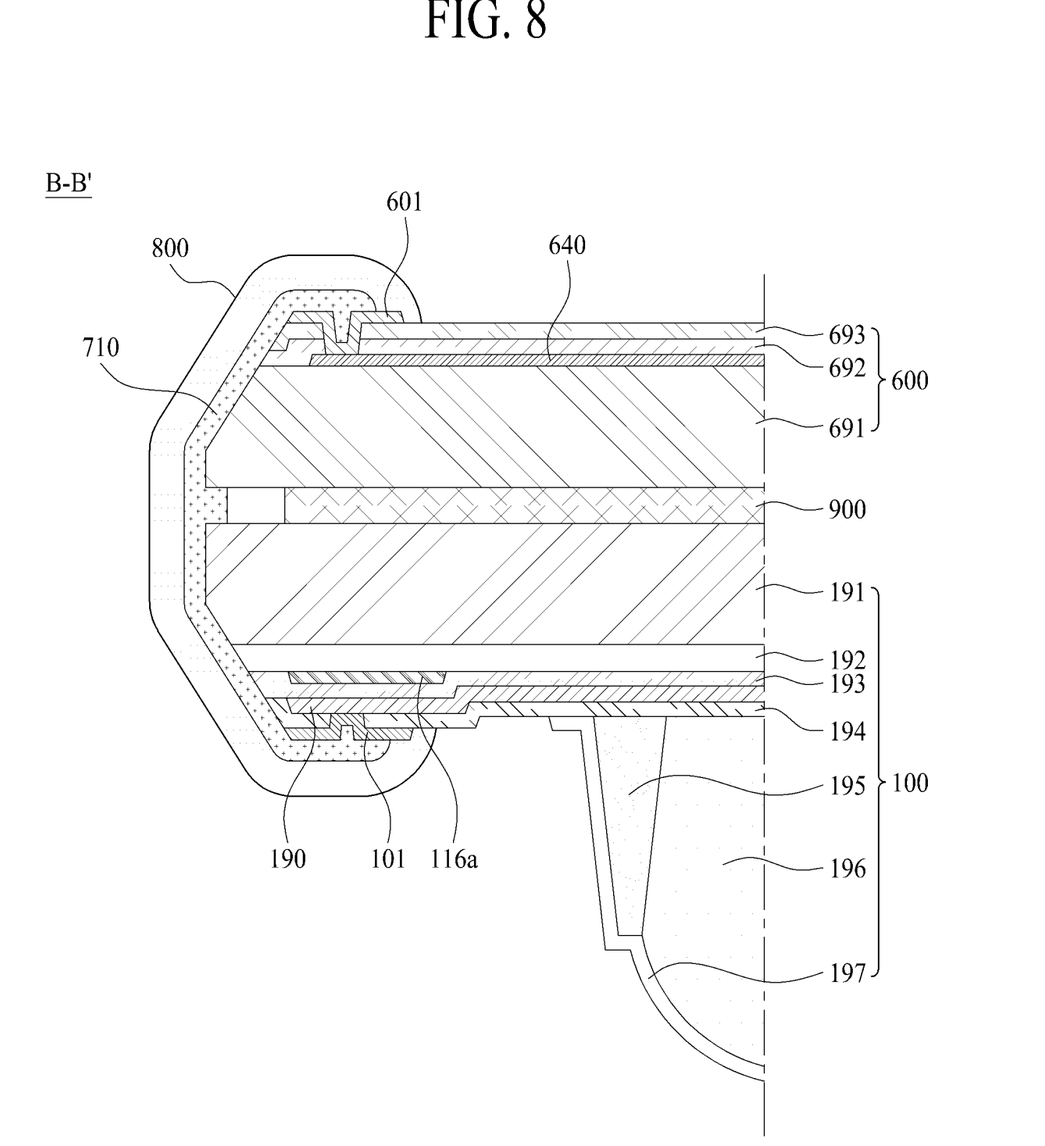
FIG. 8 is an example diagram illustrating a cross-sectional surface taken along line B-B' illustrated in FIG. 6.

FIG. 6 is an example diagram schematically illustrating a rear surface of a light emitting display apparatus according to the present disclosure, FIG. 7 is an example diagram illustrating a cross-sectional surface taken along line A-A' illustrated in FIG. 6, and FIG. 8 is an example diagram illustrating a cross-sectional surface taken along line B-B' illustrated in FIG. 6.

Particularly, in FIG. 6, a light emitting display apparatus including a 1-1$^{th}$ test pad portion 115 and one 2-1$^{th}$ test pad portion 615 is illustrated as an example of the present disclosure. Also, for convenience of description, a light emitting display apparatus where the number of routing lines 710 and test routing lines 720 provided on a lateral surface is 18 is illustrated in FIG. 6 as an example of the present disclosure. However, the number of routing lines 710 and test routing lines 720 may be variously set based on a size of a light emitting display apparatus.

As described above, a 1-1$^{th}$ test pad portion 115 may include two 1-1$^{th}$ test pads 113 adjacent to each other, and a 2-1$^{th}$ test pad portion 615 may include two 2-1$^{th}$ test pads 613 which are adjacent to each other and are connected to each other through a test pad connection line 616.

The two 1-1$^{th}$ test pads 113 may be respectively connected to the two 2-1$^{th}$ test pads 613 facing each other through a test routing line 720.

That is, the light emitting display apparatus according to the present disclosure may include one 1-1$^{th}$ test pad portion 115 and one 2-1$^{th}$ test pad portion 615.

In this case, one of the two 1-1$^{th}$ test pads 113 may be connected to a 1-1$^{th}$ main test pad 111, and the other of the two 1-1$^{th}$ test pads 113 may be connected to a 1-2$^{th}$ main test pad 112.

For example, in the light emitting display apparatus illustrated in FIG. 6, one 1-1$^{th}$ test pad 113 may be connected to the 1-1$^{th}$ main test pad 111 provided at a right side of the light emitting display apparatus, and one other 1-1$^{th}$ test pad 113 may be connected to the 1-2$^{th}$ main test pad 112 provided at a left side of the light emitting display apparatus.

In this case, the 1-1$^{th}$ main test pad 111 and one of the two 1-1$^{th}$ test pads 113 may be connected to each other through a 1-1$^{th}$ main connection line 116a, and the 1-2$^{th}$ main test pad 112 and the other of the two 1-1$^{th}$ test pads 113 may be connected to each other through a 1-2$^{th}$ main connection line 116b.

For example, as illustrated in FIG. 6, the 1-1$^{th}$ main test pad 111 and one 1-1$^{th}$ test pads 113 may be connected to each other through the 1-1$^{th}$ main connection line 116a, and the 1-2$^{th}$ main test pad 112 and the other 1-1$^{th}$ test pads 113 may be connected to each other through the 1-2$^{th}$ main connection line 116b.

That is, the 1-2$^{th}$ main connection line 116b may be connected to the 1-2$^{th}$ main test pad 112, and as illustrated in FIG. 7, the 1-1$^{th}$ main connection line 116a may be connected to the 1-1$^{th}$ main test pad 111.

In this case, the 1-1$^{th}$ main test pad 111 may be connected to the 1-1$^{th}$ main connection line 116a, or as illustrated in FIG. 7, may be connected to the 1-1$^{th}$ main connection line 116a through a 1-1$^{th}$ main test pad electrode 114. The 1-1$^{th}$ main test pad electrode 114 may be formed on the same layer as the signal line 190.

Moreover, the 1-1$^{th}$ main connection line 116a may be insulated from the first pads 101, and the 1-2$^{th}$ main connection line 116b may be insulated from the first pads 101.

For example, as illustrated in FIG. 8, the 1-1$^{th}$ main connection line 116a may overlap the first pads 101 with an insulation layer 193 therebetween, and moreover, the 1-2$^{th}$ main connection line 116b may overlap the first pads 101 with the insulation layer 193 therebetween.

To provide an additional description, in FIGS. 7 and 8, a first substrate 100 may include a first base substrate 191, a buffer 192, an insulation layer 193, a first passivation layer 194, a dam 195, a second passivation layer 196, and an encapsulation layer 197. For example, various electrodes may be disposed between the buffer 192, the insulation layer 193, and the first passivation layer 194. Therefore, the various transistors configuring the pixel driving circuit PDC described above with reference to FIG. 2 and the stage transistors described above with reference to FIG. 5 may be provided. A light emitting device ED may be provided on the first passivation layer 194 and may be protected by the second passivation layer 196, and finally, the encapsulation layer 197 may be provided on the second passivation layer 196. Also, the dam 195 for supporting the second passivation layer 196 may be provided at an end of a display area 120.

In this case, the 1-1$^{th}$ main connection line 116a may be provided between the buffer 192 and the insulation layer 193, the signal lines 190 and the 1-1$^{th}$ main test pad electrode 114 may be provided between the insulation layer 193 and the first passivation layer 194, and the first pads 101, the 1-1$^{th}$ main test pad 111, the 1-2$^{th}$ main test pad 112, and the 1-1$^{th}$ test pads 113 may be provided on the first passivation layer 194.

Therefore, the 1-1$^{th}$ main connection line 116a may overlap the first pads 101 with the insulation layer 193 therebetween.

However, the first substrate 100 may be formed in various structures in addition to a structure illustrated in FIGS. 7 and 8.

Moreover, in FIGS. 7 and 8, a second substrate 600 may include a second base substrate 691, a first layer 692, and a second layer 693.

For example, the link lines 640, the 2-1$^{th}$ test link line 620, and the 2-2$^{th}$ test link line 630 may be provided between the second base substrate 691 and the first layer 692.

The second pads 601, the 2-1$^{th}$ main test pad 611, the 2-2$^{th}$ main test pad 612, and the 2-1$^{th}$ test pads 613 may be provided on one of the first layer 692 and the second layer 693.

In this case, the routing lines 710, the test routing lines 720, the first pads 101, the 1-1$^{th}$ main test pad 111, the 1-2$^{th}$ main test pad 112, the 1-1$^{th}$ test pads 113, the second pads 601, the 2-1$^{th}$ main test pad 611, the 2-2$^{th}$ main test pad 612, and the 2-1$^{th}$ test pads 613 may be protected by a coating layer 800 as illustrated in FIGS. 7 and 8.

In the light emitting display apparatus according to the present disclosure described above with reference to FIGS. 6 to 8, the 2-1$^{th}$ measurement pad 621 may be electrically connected to the 2-2$^{th}$ measurement pad 631 through the 2-1$^{th}$ test link line 620, the 2-1$^{th}$ main test pad 611, the test routing line 720, the 1-1$^{th}$ main test pad 111, the first connection line 116a, the 1-1$^{th}$ test pad 613, the test routing line 720, the 2-1$^{th}$ test pad 613, the test pad connection line 616, the 2-1$^{th}$ test pad 613, the test routing line 720, the 1-1$^{th}$ test pad 613, the second connection line 116, the 1-2$^{th}$ main test pad 112, the test routing line 720, the 2-2$^{th}$ main test pad 612, and the 2-2$^{th}$ test link line 630.

In this case, positions of the 1-1$^{th}$ test pads 613 and the 2-1$^{th}$ test pads 613 may be variously changed based on a position at which resistances of routing lines are to be measured.

For example, in manufactured light emitting display apparatuses, the 1-1$^{th}$ test pads 613 and the 2-1$^{th}$ test pads 613 may be disposed at positions at which there are many defects of routing lines. In this case, when a resistance value measured from each of the 2-1$^{th}$ measurement pad 621 and the 2-2$^{th}$ measurement pad 631 electrically connected to the test routing lines 720 is within a predetermined or selected resistance value range, it may be determined that all routing lines 710 provided on a lateral surface of the light emitting display apparatus are normal.

However, when a resistance value measured from each of the 2-1$^{th}$ measurement pad 621 and the 2-2$^{th}$ measurement pad 631 electrically connected to the test routing lines 720 is outside the predetermined or selected resistance value range, it may be determined that a defect occurs in other routing lines 710 provided on the lateral surface of the light emitting display apparatus. In this case, the occurrence or not of defects of the routing lines 710 may be determined through a more precise test.

In the light emitting display apparatus according to the present disclosure described above with reference to FIGS. 6 to 8, the 1-1$^{th}$ test pads 613 and the 2-1$^{th}$ test pads 113 may be disposed at only one of various positions of the lateral surface of the light emitting display apparatus.

In this case, even when a measured resistance value is normal, there may be a possibility that a defect occurs in the routing lines 710 disposed at other positions.

Therefore, in the present disclosure, as described below, the test routing lines 720 may be disposed at two or more positions of the lateral surface of the light emitting display apparatus.

Figure 9:
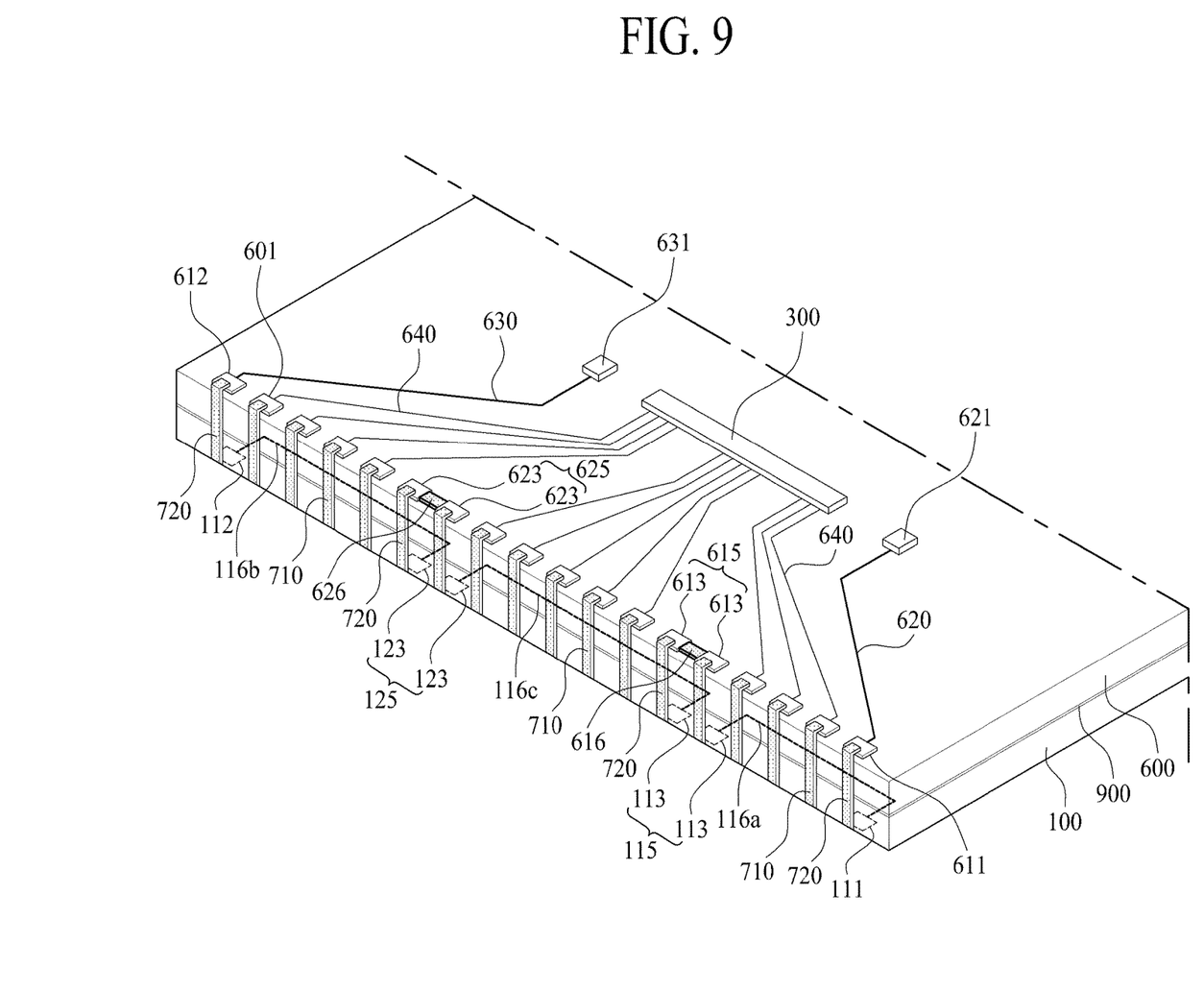
FIGS. 9 to 11 are other example diagrams schematically illustrating a rear surface of a light emitting display apparatus according to the present disclosure.
Figure 10:
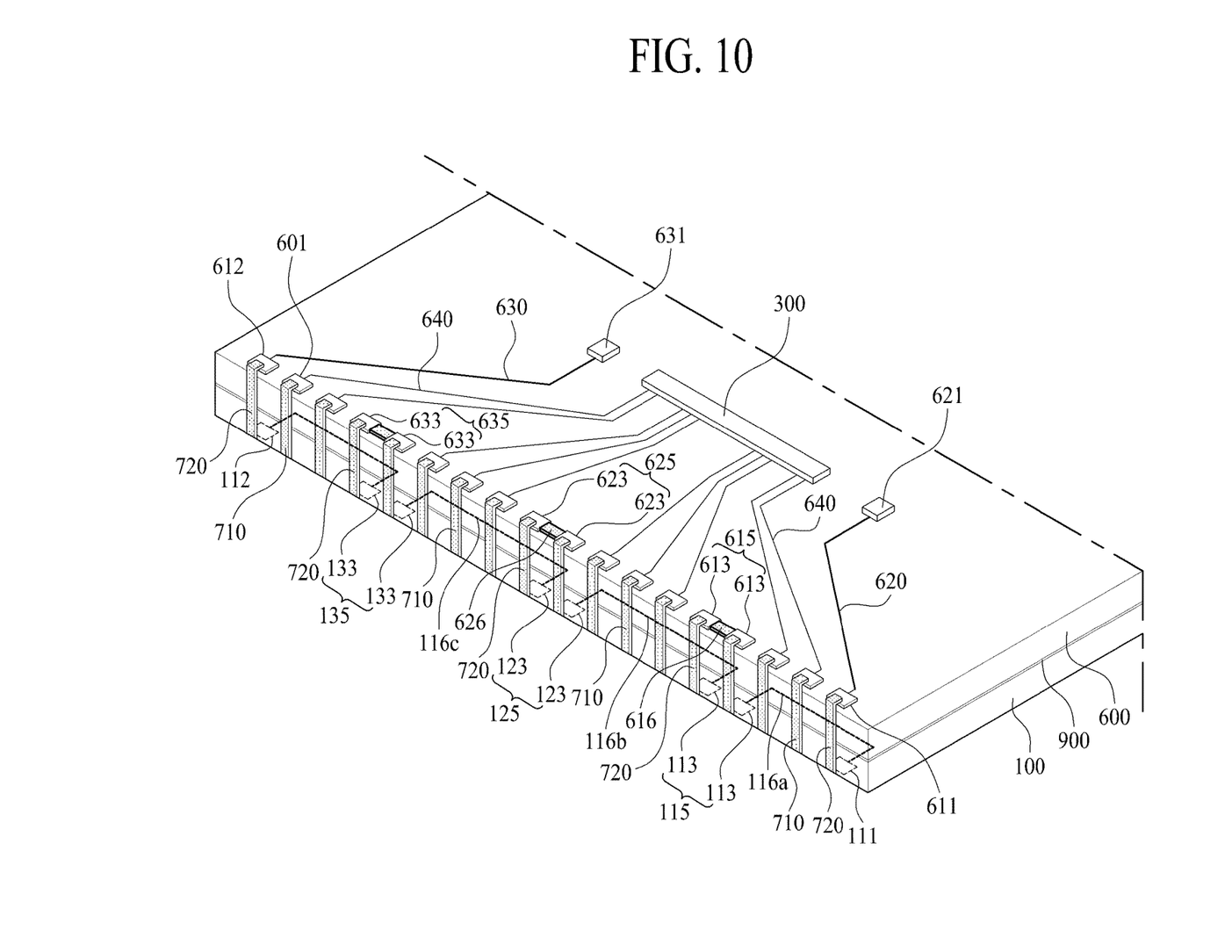
Figure 11:
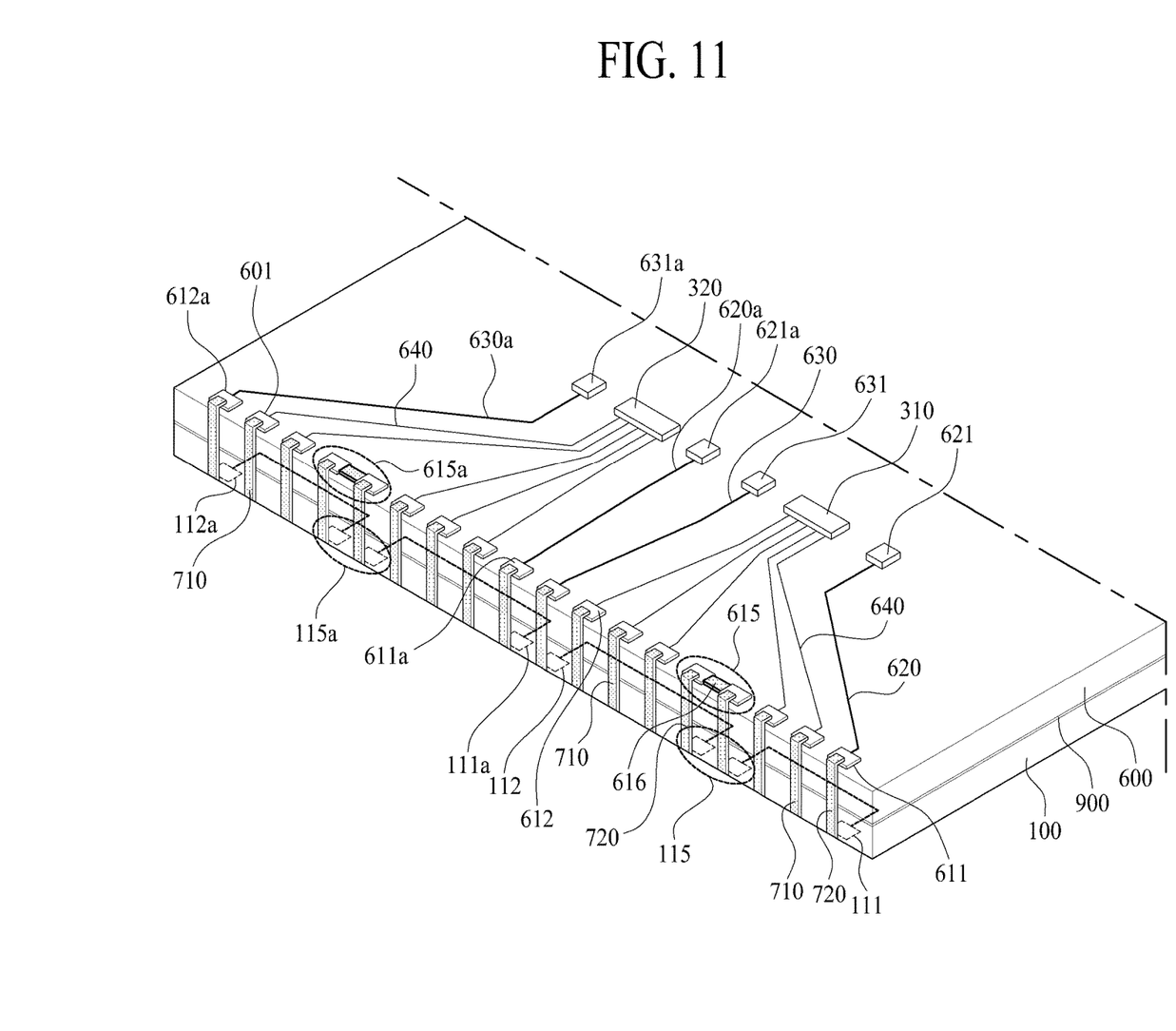

FIGS. 9 to 11 are other example diagrams schematically illustrating a rear surface of a light emitting display apparatus according to the present disclosure.

First, in FIG. 9, a light emitting display apparatus is illustrated where a $1\text{-}2^{th}$ test pad portion 125 and a $2\text{-}2^{th}$ test pad portion 625 are further provided along with the $1\text{-}1^{th}$ test pad portion 115 and the $2\text{-}1^{th}$ test pad portion 615.

That is, a first pad portion 110 may further include a $1\text{-}2^{th}$ test pad portion 125 provided between a $1\text{-}1^{th}$ main test pad 111 and a $1\text{-}2^{th}$ main test pad 112, in addition to the $1\text{-}1^{th}$ test pad portion 115, and a second pad portion 610 may further include a $2\text{-}2^{th}$ test pad portion 625 provided between a $2\text{-}1^{th}$ main test pad 611 and a $2\text{-}2^{th}$ main test pad 612, in addition to the $2\text{-}1^{th}$ test pad portion 615. The $1\text{-}2^{th}$ test pad portion 125 may include two $1\text{-}2^{th}$ test pads 123 adjacent to each other. The $2\text{-}2^{th}$ test pad portion 625 may include two $2\text{-}2^{th}$ test pads 623 which are adjacent to each other and are connected to each other through a $2\text{-}2^{th}$ test pad connection line 626.

Each of the two $1\text{-}2^{th}$ test pads 123 may be connected a $2\text{-}2^{th}$ test pad 623 facing each other among the two $2\text{-}2^{th}$ test pads 623 through a test routing line 720.

In this case, one of two $1\text{-}1^{th}$ test pads 113 may be connected to the $1\text{-}1^{th}$ main test pad 111 through a $1\text{-}1^{th}$ main connection line 116a, one of two $1\text{-}2^{th}$ test pads 123 may be connected to the $1\text{-}2^{th}$ main test pad 112 through a $1\text{-}2^{th}$ main connection line 116b, and the other of the two $1\text{-}1^{th}$ test pads 113 may be connected to the other of the two $1\text{-}2^{th}$ test pads 123 through a $1\text{-}3^{th}$ main connection line 116c.

According to the present disclosure described above, test routing lines 720 may be provided at two portions of the light emitting display apparatus (for example, a left portion and a right portion of the light emitting display apparatus) as illustrated in FIG. 9.

In this case, when a resistance value measured from each of the test routing lines 720 disposed at the two portions is within a predetermined or selected range, it may be predicted that routing lines 710 near the test routing lines 720 disposed at the two portions are normal. Accordingly, the test reliability of the routing lines 710 may be enhanced.

Second, in order to more enhance the test reliability of the routing lines 710, at least one $1\text{-}3^{th}$ test pad portion 135 and at least one $2\text{-}3^{th}$ test pad portion 635 may be further provided on a lateral surface of the light emitting display apparatus, in addition to the $1\text{-}1^{th}$ test pad portion 115, the $2\text{-}1^{th}$ test pad portion 615, the $1\text{-}2^{th}$ test pad portion 125, and the $2\text{-}2^{th}$ test pad portion 625.

That is, the first pad portion 110 may further include the at least one $1\text{-}3^{th}$ test pad portion 135 provided between the $1\text{-}1^{th}$ main test pad 111 and the $1\text{-}2^{th}$ main test pad 112, and the second pad portion 610 may further include the at least one $2\text{-}3^{th}$ test pad portion 635 provided between the $2\text{-}1^{th}$ main test pad 611 and the $2\text{-}2^{th}$ main test pad 612.

For example, in FIG. 10, a light emitting display apparatus is illustrated where the at least one $1\text{-}3^{th}$ test pad portion 135 and the at least one $2\text{-}3^{th}$ test pad portion 635 are further provided in addition to the $1\text{-}1^{th}$ test pad portion 115, the $2\text{-}1^{th}$ test pad portion 615, the $1\text{-}2^{th}$ test pad portion 125, and the $2\text{-}2^{th}$ test pad portion 625.

In this case, a method of connecting the $1\text{-}3^{th}$ test pad portion 135 and the $2\text{-}3^{th}$ test pad portion 635 to other elements may be similar to a method of connecting the $1\text{-}2^{th}$ test pad portion 125 and the $2\text{-}2^{th}$ test pad portion 625 to other elements, and thus, detailed descriptions thereof are omitted.

According to the present disclosure described above, the test routing lines 720 may be provided at three portions of the lateral surface of the light emitting display apparatus, and test pad portions corresponding to the $1\text{-}3^{th}$ test pad portion 135 and the $2\text{-}3^{th}$ test pad portion 635 may be further provided. Accordingly, the test routing lines 720 may be provided at three or more portions of the lateral surface of the light emitting display apparatus.

In this case, when a resistance value measured from each of the test routing lines 720 disposed at three or more portions is within a predetermined or selected range, it may be predicted that routing lines 710 near the test routing lines 720 disposed at the three or more portions are normal. Accordingly, the test reliability of the routing lines 710 may be enhanced.

Third, the light emitting display apparatus according to the present disclosure described above with reference to FIGS. 9 and 10 may include a $2\text{-}1^{th}$ measurement pad 621 and a $2\text{-}2^{th}$ measurement pad 631.

However, as illustrated in FIG. 11, the light emitting display apparatus according to the present disclosure may further include a $4\text{-}1^{th}$ measurement pad 621a and a $4\text{-}2^{th}$ measurement pad 631a, in addition to the $2\text{-}1^{th}$ measurement pad 621 and the $2\text{-}2^{th}$ measurement pad 631.

To this end, the light emitting display apparatus according to the present disclosure may further include a $3\text{-}1^{th}$ main test pad 111a, a $3\text{-}2^{th}$ main test pad 112a, a $3\text{-}1^{th}$ test pad portion 115a, a $4\text{-}1^{th}$ main test pad 611a, a $4\text{-}2^{th}$ main test pad 612a, and a $4\text{-}1^{th}$ test pad portion 615a respectively corresponding to the $1\text{-}1^{th}$ main test pad 111, the $1\text{-}2^{th}$ main test pad 112, the $1\text{-}1^{th}$ test pad portion 115, the $2\text{-}1^{th}$ main test pad 611, the $2\text{-}2^{th}$ main test pad 612, and the $2\text{-}1^{th}$ test pad portion 615.

In this case, the $2\text{-}1^{th}$ main test pad 611 may be provided at one end of the second pad portion 610, the $2\text{-}2^{th}$ main test pad 612 may be provided at a center portion of the second pad portion 610, the $4\text{-}1^{th}$ main test pad 611a may be provided adjacent to the $2\text{-}2^{th}$ main test pad 612 at a center portion of the second pad portion 610, and the $4\text{-}2^{th}$ main test pad 612a may be provided at the other end of the second pad portion 610.

For example, as illustrated in FIG. 11, the $2\text{-}1^{th}$ main test pad 611 may be provided at a right end of the second pad portion 610, the $2\text{-}2^{th}$ main test pad 612 may be provided at the center portion of the second pad portion 610, the $4\text{-}1^{th}$ main test pad 611a may be provided adjacent to the $2\text{-}2^{th}$ main test pad 612 at the center portion of the second pad portion 610, and the $4\text{-}2^{th}$ main test pad 612a may be provided at a left end of the second pad portion 610.

Moreover, the $1\text{-}1^{th}$ main test pad 111 may be provided at a right end of the first pad portion 110, the $1\text{-}2^{th}$ main test pad 112 may be provided at a center portion of the first pad portion 110, the $3\text{-}1^{th}$ main test pad 111a may be provided adjacent to the $1\text{-}2^{th}$ main test pad 112 at the center portion of the first pad portion 110, and the $3\text{-}2^{th}$ main test pad 112a may be provided at a left end of the first pad portion 110.

In this case, the $2\text{-}1^{th}$ measurement pad 621 connected to a resistance measurement device may be provided at an end of the $2\text{-}1^{th}$ test link line 620 connected to the $2\text{-}1^{th}$ main test pad 611, and the $2\text{-}2^{th}$ measurement pad 631 connected to the resistance measurement device may be provided at an end of the $2\text{-}2^{th}$ test link line 630 connected to the $2\text{-}2^{th}$ main test pad 612. Also, the $4\text{-}1^{th}$ measurement pad 621a connected to the resistance measurement device may be provided at an end of the 4-1$^{th}$ test link line 620a connected to the 4-1$^{th}$ main test pad 611a, and the 4-2$^{th}$ measurement pad 631a connected to the resistance measurement device may be provided at an end of the 4-2$^{th}$ test link line 630a connected to the 4-2$^{th}$ main test pad 612a.

In this case, as illustrated in FIG. 11, the test routing lines 720 may be provided at two portions of the lateral surface of the light emitting display apparatus.

Therefore, as described above with reference to FIG. 9, when a resistance value measured from each of the test routing lines 720 disposed at two portions is within a predetermined or selected range, it may be predicted that routing lines 710 near the test routing lines 720 disposed at the two portions are normal. Accordingly, the test reliability of the routing lines 710 may be enhanced.

In this case, in the light emitting display apparatus illustrated in FIG. 11, test routing lines 720 may be provided at two or more portions between the 2-1$^{th}$ main test pad 611 and the 2-2$^{th}$ main test pad 612, and test routing lines 720 may be provided at two or more portions between the 4-1$^{th}$ main test pad 611a and the 4-2$^{th}$ main test pad 612a. Accordingly, the test reliability of the routing lines 710 may be enhanced.

Link lines 640 connected to a first data driver IC 310 configuring a data driver 300 may be provided between a 2-1$^{th}$ test link line 620 connected to the 2-1$^{th}$ main test pad 611 and a 2-2$^{th}$ test link line 630 connected to the 2-2$^{th}$ main test pad 612, and link lines 640 connected to a second data driver IC 320 configuring the data driver 300 may be provided between a 4-1$^{th}$ test link line 620a connected to the 4-1$^{th}$ main test pad 611a and a 4-2$^{th}$ test link line 630a connected to the 4-2$^{th}$ main test pad 612a.

The first data driver IC 310 and the second data driver IC 320 may be provided on different PCBs.

That is, positions of the first and second data driver ICs 310 and 320 configuring the data driver 300 may be variously changed based on an arrangement structure of the link lines 640, the 2-1$^{th}$ test link line 620, the 2-2$^{th}$ test link line 630, the 4-1$^{th}$ test link line 620a, and the 4-2$^{th}$ test link line 630a.

Moreover, in FIG. 11, a light emitting display apparatus including two data driver ICs 310 and 320 is illustrated, but is not limited thereto and the light emitting display apparatus according to the present disclosure may include three or more data driver ICs.

That is, the light emitting display apparatus according to the present disclosure may further include at least one 5-1$^{th}$ main test pad, at least one 5-2$^{th}$ main test pad, at least one 5-1$^{th}$ test pad portion, at least one 6-1$^{th}$ main test pad, at least one 6-2$^{th}$ main test pad, and at least one 6-1$^{th}$ test pad portion respectively corresponding to the 3-1$^{th}$ main test pad 111a, the 3-2$^{th}$ main test pad 112a, the 3-1$^{th}$ test pad portion 115a, the 4-1$^{th}$ main test pad 611a, the 4-2$^{th}$ main test pad 612a, and the 4-1$^{th}$ test pad portion 615a.

When the above-described elements are further provided, the number of positions at which the test routing lines 720 are provided may more increase.

As described above, as the number of positions at which the test routing lines 720 increases, the test reliability of the routing lines 710 may be more enhanced.

To provide an additional description, the light emitting display apparatus according to the present disclosure may include at least two measurement pad portions connected to the second pad portion 610 and the resistance measurement device.

Each of the at least two measurement pad portions may be connected to the second pad portion.

In this case, each of the at least two measurement pad portions may include two measurement pads connected to the resistance measurement device.

For example, in FIG. 11, a light emitting display apparatus including two measurement pad portions is illustrated. In this case, one of the two measurement pad portions may include the 2-1$^{th}$ measurement pad 621 and the 2-2$^{th}$ measurement pad 631 connected to the resistance measurement device, and the other of the two measurement pad portions may include the 4-1$^{th}$ measurement pad 621a and the 4-2$^{th}$ measurement pad 631a.

In this case, two measurement pads (for example, the 2-1$^{th}$ measurement pad 621 and the 2-2$^{th}$ measurement pad 631) included in one measurement pad portion may be connected to the second pad portion 610, and the second pad portion 610 may be connected to the first pad portion 110 through the at least two test routing lines 720 included in the routing portion 700.

That is, two measurement pads (for example, the 2-1$^{th}$ measurement pad 621 and the 2-2$^{th}$ measurement pad 631) included in one measurement pad portion may be connected to the 2-1$^{th}$ main test pad 611 and the 2-2$^{th}$ main test pad 612 included in the second pad portion 610, and the 2-1$^{th}$ main test pad 611 and the 2-2$^{th}$ main test pad 612 may be connected to the 1-1$^{th}$ main test pad 111 and the 1-2$^{th}$ main test pad 112 included in the first pad portion 110 through the at least two test routing lines 720, whereby one resistance measurement line may be formed.

According to the present disclosure, because test pads for measuring resistances of routing lines are provided between pads provided on a lateral surface of a light emitting display panel, the occurrence or not of defects of the routing lines provided on the lateral surface may be more accurately determined than the related art.

Therefore, a light emitting display apparatus where a defect occurs in the routing lines may be accurately determined, and thus, a probability that a defective light emitting display apparatus is released may be reduced.

Moreover, a repair process may be performed on a light emitting display apparatus where a defect occurs in the routing lines, and thus, a defect rate of light emitting display apparatuses may decrease.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display apparatus comprising:
a first substrate including pixels and signal lines arranged in a first direction; and
a second substrate disposed on a rear surface of the first substrate,
wherein a routing portion including routing lines is provided on a first lateral surface of the first substrate and a second lateral surface of the second substrate,
in the first substrate, a first pad portion adjacent to the first lateral surface includes first pads connected to the signal lines and the routing lines and first test pads for determining the occurrence or not of defects of the routing lines, and
in the second substrate, a second pad portion adjacent to the second lateral surface includes second pads connected to the routing lines and second test pads connected to the first test pads.

2. The light emitting display apparatus of claim 1, wherein the first pad portion comprises a first main test pad, a third main test pad, and a first test pad portion provided between the first main test pad and the third main test pad, and
the second pad portion comprises a second main test pad, a fourth main test pad, and a second test pad portion provided between the second main test pad and the fourth main test pad.

3. The light emitting display apparatus of claim 2, wherein the first test pad portion comprises two first test pads adjacent to each other and the second test pad portion comprises two second test pads which are adjacent to each other and are connected to each other, and
each of the two first test pads is connected to a respective second test pad facing each other among the two second test pads through a test routing line included in the routing portion.

4. The light emitting display apparatus of claim 3, wherein one of the two first test pads is connected to the first main test pad, and the other of the two first test pads is connected to the third main test pad.

5. The light emitting display apparatus of claim 4, wherein the one of the two first test pads connected to the first main test pad is connected through a first main connection line,
the other of the two first test pads connected to the third main test pad is connected through a third main connection line,
the first main connection line is insulated from the first pads, and
the third main connection line is insulated from the first pads.

6. The light emitting display apparatus of claim 3, wherein the first pad portion further comprises a third test pad portion provided between the first main test pad and the third main test pad, and the second pad portion further comprises a fourth test pad portion provided between the second main test pad and the fourth main test pad.

7. The light emitting display apparatus of claim 6, wherein the third test pad portion comprises two third test pads adjacent to each other and the fourth test pad portion comprises two fourth test pads which are adjacent to each other and are connected to each other, and
each of the two third test pads is connected to a respective fourth test pad facing each other among the two fourth test pads through a test routing line included in the routing portion.

8. The light emitting display apparatus of claim 7, wherein one of the two first test pads is connected to the first main test pad through a first main connection line,
one of the two third test pads is connected to the third main test pad through a third main connection line, and
the other of the two first test pads is connected to the other of the two third test pads through a fifth main connection line.

9. The light emitting display apparatus of claim 6, wherein the first pad portion further comprises at least one fifth test pad portion provided between the first main test pad and the third main test pad, and
the second pad portion further comprises at least one sixth test pad portion provided between the second main test pad and the fourth main test pad.

10. The light emitting display apparatus of claim 2, wherein the second substrate comprises:
link lines connected to the second pads;
a second test link line connected to the second main test pad; and
a fourth test link line connected to the fourth main test pad.

11. The light emitting display apparatus of claim 10, wherein a second measurement pad connected to a resistance measurement device is provided at an end of the second test link line, and
a fourth measurement pad connected to the resistance measurement device is provided at an end of the fourth test link line.

12. The light emitting display apparatus of claim 10, wherein the link lines are provided between the second test link line and the fourth test link line.

13. The light emitting display apparatus of claim 1, wherein the second substrate comprises:
link lines connected to the second pads; and
at least two measurement pad portions connected to the second pad portion and a resistance measurement device, and
each of the at least two measurement pad portions is connected to the second pad portion.

14. The light emitting display apparatus of claim 13, wherein each of the at least two measurement pad portions comprises two measurement pads connected to the resistance measurement device,
the two measurement pads are connected to the second pad portion, and
the second pad portion is connected to the first pad portion through at least two test routing lines included in the routing portion.

* * * * *